United States Patent [19]

Chu et al.

[11] Patent Number: 4,870,027
[45] Date of Patent: Sep. 26, 1989

[54] SENSITIZATION PRETREATMENT OF PB-SALT EPITAXIAL FILMS FOR SCHOTTKY DIODES BY SULFUR VAPOR EXPOSURE

[75] Inventors: Tak-Kin Chu, Bethesda; Francisco Santiago, Elkridge, both of Md.

[73] Assignee: The United States of America as represented by the Secretary of the Navy, Washington, D.C.

[21] Appl. No.: 224,958

[22] Filed: Jul. 27, 1988

[51] Int. Cl.$^4$ .................. H01L 21/203; H01L 21/363; H01L 27/14; H01L 31/00
[52] U.S. Cl. .......................................... 437/3; 437/5; 437/84; 148/DIG. 63; 357/30
[58] Field of Search .................. 437/3, 4, 5, 84, 980, 437/243; 148/DIG. 63; 357/30, 61, 11

[56] References Cited

U.S. PATENT DOCUMENTS

| | | | |
|---|---|---|---|
| 3,911,469 | 10/1975 | Wrobel | 357/30 |
| 3,961,998 | 6/1976 | Scharnhorst | 357/30 |
| 3,969,743 | 7/1976 | Gorski et al. | 357/4 |
| 4,053,919 | 10/1977 | Andrews, II et al. | 357/30 |
| 4,057,476 | 11/1977 | Krikorian et al. | 357/11 |
| 4,080,723 | 3/1978 | Holloway | 357/4 |
| 4,086,555 | 4/1978 | Kirkorian et al. | 357/30 |
| 4,126,732 | 11/1978 | Schoolar et al. | 357/61 |
| 4,154,631 | 5/1979 | Schoolar | 357/30 |
| 4,170,781 | 10/1979 | Cox et al. | 357/30 |
| 4,302,531 | 11/1981 | Cox et al. | 357/30 |
| 4,339,764 | 7/1982 | Schoolar | 357/30 |
| 4,371,232 | 2/1983 | Jensen et al. | 350/1.4 |
| 4,406,050 | 9/1983 | Chu et al. | 357/30 |
| 4,442,446 | 4/1984 | Bouley et al. | 357/30 |

Primary Examiner—Olik Chaudhuri
Attorney, Agent, or Firm—Kenneth E. Walden; Roger D. Johnson

[57] ABSTRACT

In a process for preparing an infrared sentitive photodiode comprising the steps of:
(1) forming by vacuum deposition an epitaxial layer of a semiconductor alloy material selected from the group consissting of PbSe, PbTe, PbSe$_x$Te$_{1-x}$, Pb$_y$Sn$_{1-y}$Se, Pb$_y$Sn$_{1-y}$Te, Pb$_y$Sn$_{1-y}$Se$_x$Te$_{1-x}$, Pb$_z$Cd$_{1-z}$Se, Pb$_z$Cd$_{1-z}$Te, and Pb$_z$Cd$_{1-x}$Se$_x$Te$_{1-x}$, wherein $0 < x < 1$, $0 < y < 1$, and $0 < z - 1$, to cover at least a portion of the surface of a substrate composed of an infrared transparent single crystal material selected from the group consisting of
  (a) alkali metal halides and
  (b) alkaline earth halides;
(2) coating the epitaxial layer of semiconductor alloy material with a thin layer of a lead halide selected from the group consisting of PbCl$_2$, PbBr$_2$, PbF$_2$, and mixtures thereof by exposing the epitaxial layer alloy material to vapor of the lead halide in the presence of a gas selected from the group consisting of air, oxygen, and oxygen/inert gas mixtures;
(3) vacuum depositing Pb metal onto a portion of a lead halide coated epitaxial layer of semiconductor alloy material to form a non-Ohmic Pb metal contact; and
(4) forming an Ohmic contact on another portion of the epitaxial layer of semiconductor alloy material;

The improvement comprising:
after step (1) but before step (2), vacuum depositing a thin coating of sulfur onto the epitaxial layer of semiconductor alloy material by exposing the epitaxial layer to sulfur vapor wherein
  (a) sulfur vapor is maintained at a temperature $T_1$ wherein 96° C. $\leq T_1 \leq$ 106° C.,
  (b) the epitaxial layer of semiconductor alloy material is maintained at a temperature $T_2$ wherein 86° C. $\leq T_2 <$ 96° C.,
  (c) 0° C. $\leq T_1 - T_2 \leq$ 10° C. and
  (d) the pressure is kept at no more than $10^{-2}$ torr during the sulfur vapor deposition and subsequent cool down to room temperature.

10 Claims, 2 Drawing Sheets

SENSITIZATION PRETREATMENT OF PB-SALT EPITAXIAL FILMS FOR SCHOTTKY DIODES BY SULFUR VAPOR EXPOSURE

BACKGROUND OF THE INVENTION

This invention relates to photodetectors and more particularly to infrared-sensitive photodiodes.

It is well established that single crystal films of lead chalcogenides, lead tin chalcogenides, and lead cadmium chalcogenides can be epitaxially grown on heated alkali halide and alkaline earth halide substrates by vacuum evaporation. The chalcogenides used include the sulfides, selenides, tellurides, and mixtures thereof. The substrates are single crystals of infrared transparent alkali metal halides and alkaline earth halides. Examples include barium fluoride, strontium fluoride, calcium fluoride, lithium fluoride, sodium chloride, potassium chloride, etc.

It is also well known that the vacuum deposition of a metal contact of certain materials such as lead or indium, on the surface of an epitaxial layer of a lead chalcogenide, lead tin chalcogenide, or lead cadmium chalcogenide creates a non-Ohmic Schottky barrier at the point of contact, resulting in an infrared sensitive photodiode. Vacuum depositing a contact of certain other metals (e.g., Au, Ni, or Pt) at another point on the epitaxial layer provides the Ohmic contact necessary for measuring the photovoltage of the device.

Attention is called to U.S. Pat. No. 4,263,604, entitled "Graded Gap Semiconductor Detector," issued on Apr. 21, 1981, to James D. Jensen and Richard B. Schoolar wherein an extensive bibliography of articles and patents dealing with these Schottky barrier devices is listed in the background of the invention.

Alan C. Bouley, Harold R. Riedl, James D. Jensen, and Richard B. Schoolar in U.S. Pat. No. 4,442,446, entitled "Sensitized Epitaxial Infrared Detector," disclose that the presence of halide ions in the interface region between a non-Ohmic lead metal and an epitaxial layer of II-IV-VI g semiconductor alloy material (i.e., lead chalcogenide, lead tin chalcogenide, or lead cadmium chalcogenide) increases the performance of these infrared detecting diodes. The number of rejects in the manufacturing process is also reduced. In their process Bouley et al. mix the lead halide salt in with the lead used to form the epitaxial layer of semiconductor material. As a result, the halide ions are distributed throughout the semiconductor layer.

Tak-Kin Chu and Alan C. Bouley in U.S. Pat. No. 4,406,050, entitled 937 Method for Fabricating Lead Halide Sensitized Infrared Photodiodes," and Tak-Kin Chu and Francisco Santiago in U.S. Pat. No. 4,853,339 entitled "Method of Sensitizing Pb-Salt Epitaxial Films for Schottky Diodes," disclose methods in which the epitaxial layer of semiconductor material is first deposited on an infrared transparent substrate in the conventional manner. Then a layer of lead halide (PbCl$_2$, PbBr$_2$, PbF$_2$) is vapor deposited on the semiconductor material prior to the vacuum deposition of the non-ohmic pb metal contacts. Both of these processes produce even fewer rejects than the Bouley et al. process. However, when no sulfur is present in the Pb-salt epitaxial semiconductor layer, the rejection rate is still as high as 25 percent. Typical of such compositions are PbSe, PbTe, PbSe$_x$Te$_{1-x}$, Pb$_y$Sn$_{1-y}$Se, Pb$_y$Sn$_{1-y}$Te, Pb$_y$Sn$_{1-y}$Se$_x$Te$_{1-x}$, Pb$_z$Cd$_{1-z}$Se, Pb$_z$Cd$_{1-z}$Te, and Pb$_z$Cd$_{1-z}$Se$_x$Te$_{1-x}$. It would be desirable to reduce the rejection rates while maintaining the photodiode characteristics of these semiconductor compositions.

SUMMARY OF THE INVENTION

Accordingly, an object of this invention is to provide an improved method of producing infrared sensitive Schottky barrier photodiodes.

Another object of this invention is to reduce the number of rejects resulting during the production of infrared sensitive Schottky barrier photodiodes.

These and other objects of this invention are achieved by providing

In a process for preparing an infrared sensitive photodiode comprising the steps of:

(1) forming by vacuum deposition an epitaxial layer of a semiconductor alloy material selected from the group consisting of PbSe, PbTe, PbSe$_x$Te$_{1-x}$, Pb$_y$Sn$_{1-y}$Se, Pb$_y$Sn$_{1-y}$Te, Pb$_y$Sn$_{1-y}$Se$_x$Te$_{1-x}$, Pb$_z$Cd$_{1-z}$Se, Pb$_z$Cd$_{1-z}$Te, and Pb$_z$Cd$_{1-z}$Se$_x$Te$_{1-x}$, wherein $0<x<1$, $0<y<1$, and $0<z<1$, to cover at least a portion of the surface of a substrate composed of an infrared consisting of
(a) alkali metal halides and
(b) alkaline earth halides;

(2) coating the epitaxial layer of semiconductor alloy material with a thin layer of a lead halide selected from the group consisting of PbCl$_2$, PbBr$_2$, PbF$_2$, and mixtures thereof by exposing the epitaxial layer alloy material to vapor of the lead halide in the presence of a gas selected from the group consisting of air, oxygen, and oxygen/inert gas mixtures;

(3) vacuum depositing Pb metal onto a portion of the lead halide coated epitaxial layer of semiconductor alloy material to form a non-Ohmic Pb metal contact; and (4) forming an Ohmic contact on another portion of the epitaxial layer of semiconductor alloy material;

The improvement comprising
after step (1) but before step (2), vacuum depositing a thin coating of sulfur onto the epitaxial layer of semiconductor alloy material by exposing the epitaxial layer to sulfur vapor wherein
(a) sulfur vapor is maintained at a temperature T$_1$ wherein 96° C.$\leq$T$_1\leq$106° C.,
(b) the epitaxial layer of semiconductor alloy material is maintained at a temperature T$_2$ wherein 86° C.$\leq$T$_2\leq$96° C.,
(c) 0° C.$\leq$T$_1-$T$_2\leq$10° C. and
(d) the pressure is kept at no more than 10$^{-2}$ torr during the sulfur vapor deposition and subsequent cool down to room temperature.

BRIEF DESCRIPTION OF THE DRAWINGS

A more complete appreciation of this invention and many of the attendant advantages thereof will be readily appreciated as the same becomes better understood by reference to the following detailed description when considered in connection with the accompanying drawings:

FIG. 3 is a schematic diagram of the apparatus used for vapor deposition of PbCl$_2$ on the samples in the examples.

DETAILED DESCRIPTION OF THE PREFERRED EMBODIMENT

It is known that the presence of halide ions in the zone or region between an epitaxial layer of a II-IV-VI semiconductor alloy and a non-Ohmic Pb contact (i.e. Schottky barrier forming means) of certain sensitive photodiodes substantially enhances the performance of those diodes. However, when the II-IV-VI semiconductor alloy contains no sulfur, a high rejection rate of diodes occurs. For example, a PbSe semiconductor alloy layer with a non-ohmic Pb metal contact failed to produce a diode even with PbCl$_2$ vapor treatment. However, we have discovered that this problem is overcomed by the vapor deposition of a thin layer of sulfur onto the PbSe layer prior to the lead halide (PbCl$_2$) vapor treatment and the deposition of the Pb metal to form the non-ohmic contact. Using the new procedure we have produced diodes with a PbSe semiconductor layer and a Pb metal non-Ohmic contact which have detectivities (D*) greater than $10^{10}$ (cm Hz$^{\frac{1}{2}}$)/w at 77° K.

Figure 1:
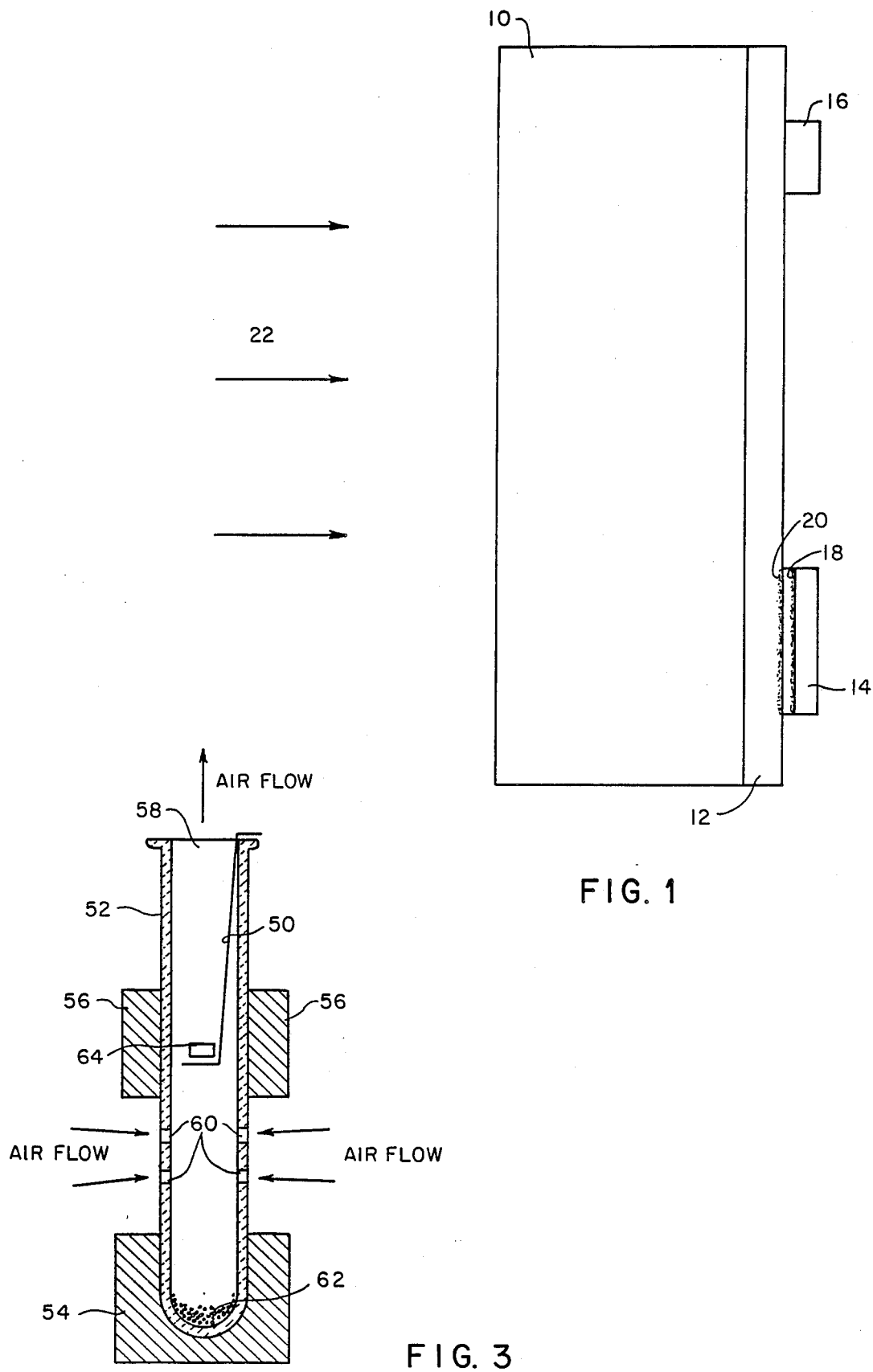
FIG. 1 is a schematic representation of a cross-sectional side view of an infrared Schottky barrier diode produced by the process of this invention.

FIG. 1 is a schematic representing a cross-sectional side view of a infrared detector produced according to the process of the present invention. It comprises a infrared transparent substrate 10, an epitaxial layer of a II-IV-VI semiconductor 12 which contains no sulfur, a thin layer of sulfur 20, a layer of lead halide 18, and a non-Ohmic Pb metal contact 14, and an Ohmic metal contact 16.

Suitable substrate 10 materials must be infrared transparent because the infrared radiation 22 must pass through the substrate 10 before reaching the semiconductor film 12. Single crystals of alkali metal halides (e.g., KCl, NaCl, KBr) and alkaline earth halides (e.g., BaF$_2$, SrF$_2$, Ba$_w$Sr$_{1-w}$F$_2$ with $0<w<1$) have been found to be suitable. However, certain of the compounds (e.g., NaCl, KCl) are less preferred or even unsuitable because they are hygroscopic. In conclusion, those substrate 10 materials which are suitable for use in the cited prior art infrared sensitive photodiodes are also suitable for the photodiodes produced by the processes of the present invention.

The epitaxial layer of semiconductor material 12 is produced by vacuum deposition of a lead chalcogenide, lead tin chalcogenide, or lead cadmium chalcogenide onto the heated substrate 10. The chalcogenides used include selenides, tellurides, and mixtures thereof. (The sulfides do not require the sulfur treatment of this process.) More specifically, some of the materials which may be used are represented by the following formulas: PbSe, PbTe, PbSe$_x$Te$_{1-x}$, Pb$_y$Sn$_{1-y}$Se, Pb$_y$Sn$_{1-y}$Te, Pb$_y$Sn$_{1-y}$Se$_x$Te$_{1-x}$, Pb$_z$Cd$_{1-z}$Se, Pb$_z$Cd$_{1-z}$Te, and Pb$_z$Cd$_{1-z}$Se$_x$Te$_{1-x}$, wherein $0<x<1$, $0<y<1$, and $0<z<1$.

The epitaxial layer of semiconductor material 12 is grown on the substrate by conventional vacuum deposition techniques. Examples of these techniques are disclosed in U.S. Pat. No. 3,716,424, entitled "Method of Preparation of Lead Sulfide PN Junction Diodes", which was issued to Richard B. Schoolar on Feb. 13, 1973 and U.S. Pat. No. 4,154,631, entitled "Equilibrium Growth Techniques for Preparing PbS$_x$Se$_{1-x}$ Epilayers," which was issued to Richard B. Schoolar on May 15, 1979, herein incorporated by reference.

After the epitaxial layer of semiconductor material has been deposited, and prior to lead (Pb) metal deposition, the semiconductor is annealed at about 170° C. for about 30 minutes in vacuum to desorb oxygen on its surface. The semiconductor is then cooled to room temperature.

Conventionally, a Schottky barrier is next formed by vacuum depositing a dot or strip of lead (Pb) metal onto a portion of the epitaxial layer of semiconductor alloy to form a non-Ohmic contact 14. This step is performed with the lead (Pb) evaporation source at a temperature of about 1200° C. or more and at a pressure of no more than $10^{-5}$ torr and preferably no more than $10^{-6}$ torr. This process takes about 10 minutes.

Chu and Bouley (U.S. Pat. No. 4,406,050), herein incorporated by reference, disclose the vapor deposition of a thin layer of a lead halide 18 which is PbCl$_2$, PbBr$_2$, PbF$_2$, or mixtures thereof onto the outer surface of the epitaxial layer of semiconductor alloy 12 prior to the vacuum deposition of Pb metal to form the non-Ohmic contact 14. PbCl$_2$ is preferred because of its relatively low toxicity. In the Chu and Bouley process, the epitaxial layer of II-IV-VI semiconductor alloy material 12 is exposed to the lead halide vapor in the presence of static air at normal atmospheric pressure. In that process the lead halide vapor source and the epitaxial layer of semiconductor material are heated at the same temperature. At least 8 hours are required for that process step to achieve the desired results (sensitization). The time required is reduced to less than 1 hour in the Chu and Santiago process U.S. Pat. No. 4,853,339) which is herein incorporated by reference. In Chu and Santiago two temperature zones and a flow of oxygen-containing gas are used. The lead halide is heated at temperature T$_1$ wherein 20° C.$\leq$T$_1\leq$500° C. and the epitaxial semiconductor layer is heated at a lower temperature T$_2$ wherein 100° C.$\leq$T$_2\leq$300° C. and wherein 100° C.$\leq$T$_1$-T$_2\leq$350° C. A fresh supply of oxygen is continuously provided to the lead halide vapor by a gentle flow of an oxygen-containing gas such as air, oxygen, or an oxygen/inert gas mixture.

Both of the Chu et al. lead halide sensitization treatments improve the performance and reduce the rejection rate of lead chalcogenide, lead tin chalcogenide, and lead cadmium chalcogenide (S, Se, Te) Schottky barrier diodes. When sulfide ions are present in the epitaxial semiconductor alloy, the Chu et al. processes reduce the rejection rate to near zero percent. However, when no sulfide ions are present in the semiconductor alloys, the rejection rate is about 25 percent.

We have discovered that by vapor deposition under vacuum of a thin layer of sulfur 20 on the surface of epitaxial films 12 of semiconductor alloys of the formulas PbSe, PbTe, PbSe$_x$Te$_{1-x}$, Pb$_y$Sn$_{1-y}$Se, Pb$_y$Sn$_{1-y}$Te, Pb$_y$Sn$_{1-y}$Se$_x$Te$_{1-x}$, Pb$_z$Cd$_{1-z}$Se, Pb$_z$Cd$_{1-z}$Te, and Pb$_z$Cd$_{1-z}$Se$_x$Te$_{1-x}$ wherein $0<x<1$, $0<y<1$, and $0<z<1$, prior to the vapor deposition of the lead halide, the rejection rate can be reduced to near zero percent. This is done without changing the infrared optical characteristics of these semiconductor alloys.

After the epitaxial film of semiconductor alloy has been grown and then annealed to desorb oxygen, the sulfur layer 20 is formed by vapor deposition under a vacuum.

Figure 2:
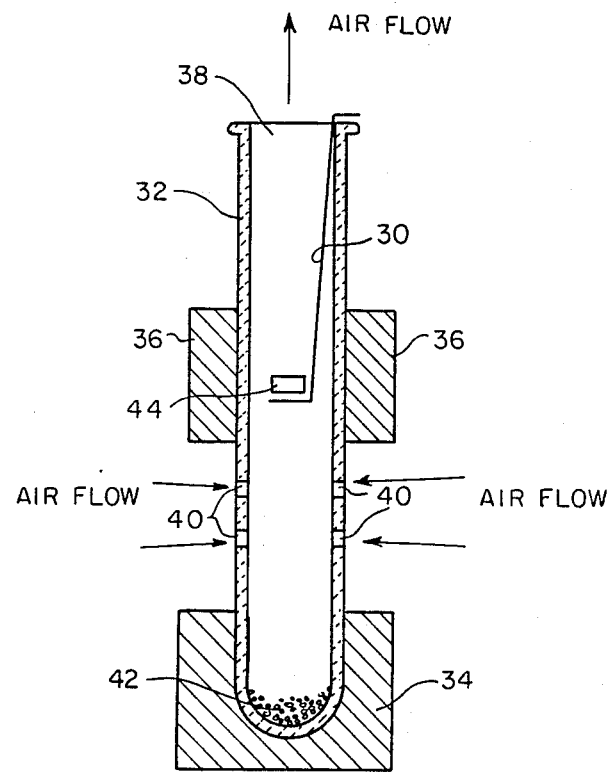
FIG. 2 is a schematic diagram of the laboratory apparatus which is used in the present processes for the vacuum deposition of sulfur onto the semiconductor alloy surface.

FIG. 2 is a schematic of the equipment used in the sulfur deposition. The apparatus includes a vacuum chamber (bell jar) 30 connected to any standard vacuum source 32 with an ion gauge 34 to measure the total pressure in the vacuum chamber 30. Disposed within the vacuum chamber 30 is sulfur powder 36 in an open container 38 which is maintained at a temperature $T_1$ by a first heater 40. The epitaxial semiconductor layer 12 (with substrate) is positioned above the sulfur 36, container 38, and first heater 40. The temperature of the epitaxial semiconductor layer 12 is maintained at a temperature $T_2$ by a second heater 42. A shutter 44 is interposed between the sulfur 32 source and the semiconductor layer 12 to control the time of exposure.

The solid sulfur 32 is heated to provide sulfur vapor at a temperature $T_1$ which is at or just above the sublimation temperature of sulfur (96° C.). Preferably $T_1$ will be from 0° C. to 10° C., more preferably from 0° C. to 3° C., and still more preferably from 0° C. to 2° C. above the sublimation temperature of sulfur. In otherwords, preferably 96° C. $\leq T_1 \leq$ 106° C., more preferably 96° C. $\leq T_1 \leq$ 99° C., and still more preferably 96° C. $\leq T_1 \leq$ 98° C.

The epitaxial semiconductor layer 12 is maintained at a temperature $T_2$ which is just below the sublimation temperature of sulfur (96° C.). Preferably $T_2$ will be from more than zero to 10° C., more preferably from more than zero to 3° C., and still more preferably from more than zero to 2° C. below the sublimation temperature of sulfur. In other words, preferably 86° C. $\leq T_2 \leq$ 96° C., more preferably 93° C. $\leq T_2 \leq$ 96° C., and still more preferably 94° C. $\leq T_2 \leq$ 96° C.

The temperature difference $T_1-T_2$ is very important. Preferably, 0° C. $\leq T_1-T_2 \leq$ 10° C., more preferably 0.5° C. $= T_1-T_2 \leq$ 3° C., and still more preferably 1° C. $\leq T_1-T_2$ 2° C.

The pressure is maintained at no more than $10^{-2}$ torr, preferably no more than $10^{-3}$ torr, more preferably no more than $10^{-4}$ torr, and still more preferably at no more than $10^{-5}$ torr inside the vacuum chamber 30.

The sulfur vapor exposure time is critical. It should be more than 3 hours, preferably 4 or more hours, more preferably 5 or more hours, and still more preferably 6 or more hours. As a practical matter the upper limits on exposure time are determined by economics. Long exposure times increase the turn around time in preparing the diodes.

After the sulfur vapor deposition is completed, the epitaxial semiconductor layer is allowed to cool to room temperature while the vacuum is maintained. After the semiconductor has reached room temperature, it is brought up to atmospheric pressure. At this time the epitaxial semiconductor film is ready for lead halide sensitization according to either the Chu and Bouley process (U.S. Pat. No. 4,406,050) or preferably the Chu and Santiago process (U.S. Pat. No. 4,853,339).

The general nature of the invention having been set forth, the following examples are presented as specific illustrations thereof. It will be understood that the invention is not limited to these specific examples, but is susceptable to various modifications that will be recognized by one of ordinary skill in the art.

EXAMPLES

The same procedure was used in examples 1 through 5 except that the sulfur vapor exposure time was varied. The apparatus shown in FIG. 2 (described above) was used for the sulfur vapor deposition step. In each example, a PbSe epitaxial semiconductor film or layer was maintained at a temperature ($T_2$) of 94-95° C. and exposed to sulfur vapor at temperature of 96° C. in a vacuum $10^{-5}$ torr pressure. A shutter mechanism was used to control the exposure time. After the sulfur vapor exposure was complete, the treated PbSe film was allowed to cool to room temperature while the vacuum was maintained.

Next each PbSe film sample was treated with $PbC_2$ vapor according to the process of Chu and Santiago (U.S. Pat. No. 4,853,339), supra. FIG. 3 schematically represents a cross-sectional side view of the apparatus used for the $PbCl_2$ vapor deposition. In FIG. 3, $PbCl_2$ powder 62 is placed in the bottom of a glass reaction vessel 52 and is maintain at a temperature of 395-400° C. by a first heater 54. The sulfur treated PbSe epitaxial PbSe film samples 64 are supported in the reaction vessel 52 above the air passages 60 and the $PbCl_2$ source 62 by a Kenthal wire 50. A second heater 56 maintains the temperature of the PbSe film sample 64 at a temperature of 145-150° C. During the process air was drawn in through ports 60 in the sides of the reaction vessel 52. The air mixed with the rising $PbCl_2$ vapors and the air/$PbCl_2$ vapor mixture flowed over the PbSe film sample 64 and then out of an opening 58 at the top of the reaction vessel 52. Each of the PbSe film samples was treated in this way for 1 hour.

Next, 10 (2 rows of 5) Pb metal contacts were formed on each of the treated sample films by conventional vapor deposition under vacuum. An Ohmic contact was also formed on each sample. If the process is successful, each Pb metal contact is non-Ohmic and forms a diode.

EXAMPLE 1

In batch 82-74, 2 PbSe films were exposed to the sulfur vapor for 1 minutes. All 20 of the Pb metal contacts were completely Ohmic and thus no diodes were formed.

EXAMPLE 2

In batch no. 82-75, 3 PbSe semiconductor films were exposed to the sulfur vapor for 1 hour. All 30 of the Pb metal contacts were completely Ohmic and thus no diodes were formed.

EXAMPLE 3

In batch no. 75(A), 2 PbSe semiconductor films were exposed to the sulfur vapor for 3 hours. All 20 of the Pb metal contacts were non-Ohmic. 17 of the diodes produce had detectivities (D*) greater than $10^{10}$ (cm Hz$^{\frac{1}{2}}$)/w at 77° K. However, 3 of the diodes produced had detectivities less than $10^{10}$ (cm Hz$^{\frac{1}{2}}$)/w at 77° K.

EXAMPLE 4

In batch no. 84-25, 2 PbSe semiconductor films were exposed to the sulfur vapor for 6 hours. All 20 of the Pb metal contacts were non-Ohmic and all 20 of the diodes produced had detectivities greater than $10^{10}$ (cm Hz$^{\frac{1}{2}}$/w at 77° K.

EXAMPLE 5

In batch no. 84-25, 2 PbSe semiconductor films were exposed to the sulfur vapor for 7 hours. All 20 of the Pb metal contacts were non-Ohmic and all 20 of the diodes produced had detectivities greater than $10^{10}$ (cm Hz$^{\frac{1}{2}}$)/w at 77° K. obviously numerous modifications and variations of the present invention are possible in light of the above teaching. It is therefore to be understood that within the scope of the appended claims the invention may be practiced otherwise than as specifically described herein.

What is claimed and desired to be secured by Letters Patent of the United States is:

1. In a process for preparing an infrared sensitive photodiode comprising the steps of:
   (1) forming by vacuum deposition an epitaxial layer of a semiconductor alloy material selected from the group consisting of PbSe, PbTe, $PbSe_xTe_{1-x}$, $Pb_ySn_{1-y}Se$, $Pb_ySn_{1-y}Te$, $Pb_ySn_{1-y}Se_xTe_{1-x}$, $Pb_zCd_zSe$, $Pb_zCd_{1-z}Te$, and $Pb_zCd_{1-z}Se_xTe_{1-x}$, wherein $0<x<1$, $0<y<1$, and $0<z<1$, to cover at least a portion of the surface of a substrate composed of an infrared transparent single crystal material selected from the group consisting of
   (a) alkali metal halides and
   (b) alkaline earth halides;
   (2) coating the epitaxial layer of semiconductor ally material with a thin layer of a lead halide selected from the group consisting of $PbCl_2$, $PbBr_2$, $PbF_2$, and mixtures thereof by exposing the epitaxial layer alloy material to vapor of the lead halide in the presence of a gas selected from the group consisting of air, oxygen, and oxygen/inert gas mixtures;
   (3) vacuum depositing Pb metal onto a portion of the lead halide coated epitaxial layer of semiconductor alloy material to form a non-Ohmic Pb metal contact; and
   (4) forming an Ohmic contact on another portion of the epitaxial layer of semiconductor alloy material;
   The improvement comprising:
   after step (1) but before step (2), vacuum depositing a thin coating of sulfur onto the epitaxial layer of semiconductor alloy material by exposing the epitaxial layer to sulfur vapor wherein
   (a) sulfur vapor is maintained at a temperature $T_1$ wherein $96°\ C. \leq T_1 \leq 106°\ C.$,
   (b) the epitaxial layer of semiconductor alloy material is maintained at a temperature $T_2$ wherein $86°\ C. \leq T_2 < 96°\ C.$,
   (c) $0°\ C. \leq T_1 - T_2 \leq 10°\ C.$ and
   (d) the pressure is kept at no more than $10^{-2}$ torr during the sulfur vapor deposition and subsequent cool down to room temperature.

2. The process of claim 1 wherein the pressure is no more than $10^{-3}$ torr.

3. The process of claim 1 wherein the pressure is no more than $10^{-4}$ torr.

4. The process of claim 1 wherein the pressure is no more than $10^{-5}$ torr.

5. The process of claim 1 wherein $96°\ C. \leq T_1 \leq 99°\ C.$, $93°\ C. \leq T_2 < 96°\ C.$, and $0.5°\ C. \leq T_1 - T_2 \leq 3°\ C.$ 6. The process of claim 5 wherein $96°\ C. \leq T_1 \leq 98°\ C.$, $94° \leq T_2 < 96°\ C.$, and $1°\ C. \leq T_1 - T_2 \leq 2°\ C.$ 7. The process of claim 1 wherein the epitaxial layer of semiconductor alloy material is exposed to the sulfur vapor for more than 3 hours.

8. The process of claim 7 wherein the epitaxial layer of semiconductor alloy material is exposed to the sulfur vapor for 4 hours or longer.

9. The process of claim 8 wherein the epitaxial layer of semiconductor alloy material is exposed to the sulfur vapor for 5 hours or longer.

10. The process of claim 9 wherein the epitaxial layer of semiconductor alloy material is exposed to the sulfur vapor for 6 hours or longer.

* * * * *